United States Patent [19]
Adler et al.

[11] Patent Number: 5,511,477
[45] Date of Patent: Apr. 30, 1996

[54] METHOD AND APPARATUS FOR THE PRODUCTION OF PHOTOPOLYMERIC RELIEF PRINTING PLATES

[75] Inventors: Uri Adler, Holon; Ori Miller, Rehovot, both of Israel

[73] Assignee: Idanit Technologies, Ltd, Tel Aviv, Israel

[21] Appl. No.: 298,246

[22] Filed: Aug. 30, 1994

[30] Foreign Application Priority Data

Sep. 3, 1993 [IL] Israel .......................... 106899

[51] Int. Cl.⁶ .................................. B41C 1/00
[52] U.S. Cl. ................... 101/401.1; 101/128.4; 101/170; 347/2; 347/53
[58] Field of Search .............. 101/128.21, 128.4, 101/129, 150, 153, 158, 163, 170, 395, 401.1, 463.1, 465–467, 487, 491; 347/53, 74, 100, 102, 2

[56] References Cited

U.S. PATENT DOCUMENTS

| | | | |
|---|---|---|---|
| 3,909,256 | 9/1975 | Wells | 101/128.4 |
| 4,003,312 | 1/1977 | Gunther | 101/401.1 |
| 4,050,077 | 9/1977 | Yamada et al. | 347/75 |
| 4,381,946 | 5/1983 | Uehara et al. | 346/100 |
| 4,718,340 | 1/1988 | Love, III | 101/128.4 |
| 4,833,486 | 5/1989 | Zerillo | 101/467 |
| 5,072,671 | 12/1991 | Schneider et al. | 101/128.21 |
| 5,121,131 | 6/1992 | Bouldin et al. | 101/463.1 |
| 5,129,321 | 7/1992 | Fadner | 101/467 |
| 5,154,121 | 10/1992 | Schneider | 101/401.1 |
| 5,156,089 | 10/1992 | McCue et al. | 101/128.4 |
| 5,250,207 | 10/1993 | Kormann et al. | 347/53 |
| 5,312,654 | 5/1994 | Arimatsu et al. | 427/511 |

FOREIGN PATENT DOCUMENTS

| | | |
|---|---|---|
| 0503621 | 9/1992 | European Pat. Off. . |
| 0588399 | 3/1994 | European Pat. Off. . |
| 2600590 | 12/1987 | France . |
| 962973 | 5/1957 | Germany . |

OTHER PUBLICATIONS

Database WPI, Derwent Publications Ltd., London, GB; AN 81–74439D & JP–A–56 105 960 (Fuji Photo Film Co., Ltd.,), 22 Aug. 1981 * abstract *.

Database WPI, Derwent Publications Ltd., London, GB; An 88–164770 & JP–A–63 102 936 (Canon K.K), 7 May 1988, * abstract *.

Database WPI, Derwent Publications Ltd., London, GB; AN 88–934518 or AN 88–034518? & SU–A–1 315 930 (Ivano–Frank Olil Res) * abstract *.

*Primary Examiner*—Stephen Funk
*Attorney, Agent, or Firm*—Sprung Horn Kramer & Woods

[57] ABSTRACT

A method and apparatus for direct production of photopolymeric printing plates. The method comprises forming a positive and/or negative image on a substrate by ink-jet printing with a photopolymeric ink composition, optionally preheated. The apparatus for carrying out the method of the invention comprises a rotatable drum adapted for retaining on its inner or outer surface the substrate to be printed; a carriage, displaceable axially in respect of the drum; a container for a photopolymeric ink composition; at least one nozzle communicating with the carriage for ejecting the photopolymeric ink composition; and a UV source located so as to expose the printed surface of the substrate to UV radiation.

3 Claims, 2 Drawing Sheets

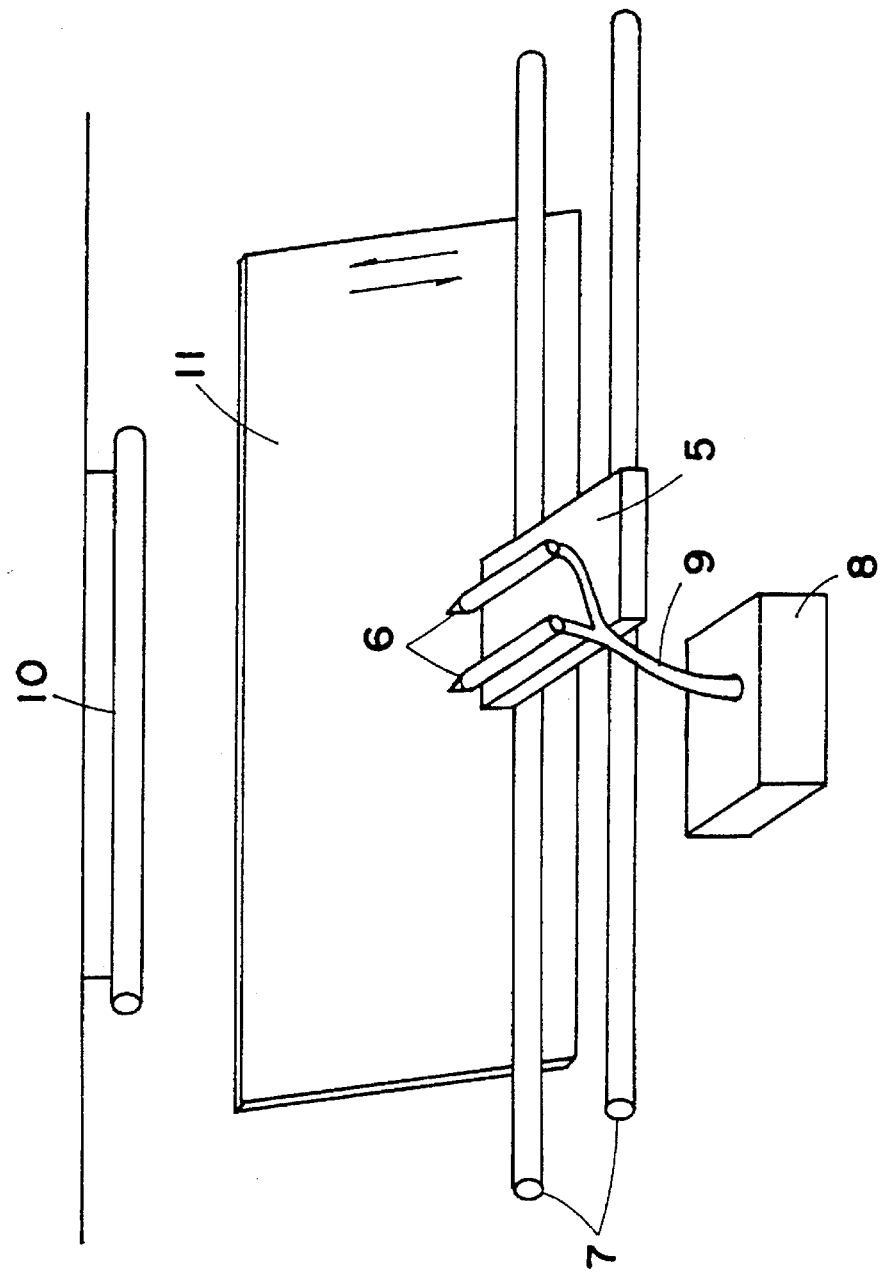

METHOD AND APPARATUS FOR THE PRODUCTION OF PHOTOPOLYMERIC RELIEF PRINTING PLATES

FIELD OF THE INVENTION

The present invention concerns a method and apparatus for direct production of photopolymeric printing plates by ink-jet printing techniques.

1. Background of the Invention

Recent years have seen an overwhelming development in the printers' art. The use of computers has provided increased speed and precision for production, control and scheduling. The progress in printing, such as the use of a scanner which directly "reads" picture images, created the necessity for direct plate-making.

One of the methods for direct plate-making uses ink-jet printing to directly form an image or "non-image" portion. Ink-jet printing is a pressureless, plateless printing process, which uses jets of colored ink to produce an image of typographic quality at modest press speeds or of legible quality at high speeds. The ink is ejected under pressure through a nozzle and dispersed into uniform droplets which are charged electrostatically and are deflected by an electric field governed by a computer or another digital image-generating device.

An example of the methods for preparing printing plates by the ink-jet printing technique is Japanese Kokai Publication 113456/1981 which proposed a method of preparing printing plates, wherein ink-repelling materials (e.g. curable silicone) are printed on a printing plate by ink-jet printing. The printing plate thus obtained is an intaglio printing plate in which the ink-repelling material formed on the surface of the substrate serves as the "non-image" part. As a result, the resolution of the printed images at shadow areas or reversed lines is not so satisfactory. Moreover, this method requires a large amount of ink, because the ink-repelling material must be deposited on the entire "non-image" part which occupies most of the surface of the printing plate. This, furthermore, delays the printing process.

Japanese Kokai Publication 69244/1992 also discloses a method for making printing plates comprising the steps of: forming a printed image by ink-jet printing on a recording material previously subjected to a hydrophilic treatment, using a hydrophobic ink containing photocurable components; and exposing the whole surface to an active radiation.

EP 533 168 A1 discloses a method for making printing plates using ink-jet printing for lithographic plates.

In the above known method, the surface of the substrate to be used for the lithographic plate must, as a rule, be first subjected to various treatments such as a mechanical graining, an anodizing or a hydrophilic treatment so as to obtain good hydrophilic properties and water retention capability. Therefore, even the use of an ink composition having a very high surface tension results in a poor image on the surface of the substrate because of ink spreading.

All printing processes, including those mentioned above, necessarily cause water pollution due to the disposal of toxic solutions, heavy metals, etc. which are used in the processes, as well as air pollution and other health hazards.

2. Object of the Invention

It is thus the object of the present invention to provide a rapid, environment-friendly and material-saving method for the direct production of printing plates.

SUMMARY OF THE INVENTION

The above object is achieved by the present invention, which provides a method for the production of photopolymeric printing plates comprising:

forming a positive and/or negative image on a substrate by ink-jet printing with a photopolymeric ink composition, optionally preheated to a temperature of about 30°–260° C.; and subjecting the resulting printed substrate to UV radiation, thereby curing said ink composition forming said image.

The present invention also provides an apparatus for carrying out the method of the present invention.

Said apparatus comprises:

i) A rotatable drum adapted for retaining on its inner or outer surface a substrate to be printed;

ii) a carriage, displaceable axially in respect of said drum;

iii) a container for a photopolymeric ink composition;

iv) at least one nozzle communicating with said carriage for ejecting said photopolymeric ink composition; and v) a U.V. source located so as to expose the printed surface of the substrate to UV radiation.

DESCRIPTION OF THE INVENTION

The photopolymeric ink composition used in the method of the present invention may be any conventional photopolymeric material.

In accordance with an embodiment of the invention, said photopolymeric material comprises from about 0.5 to about 20% of a ferromagnetic powder, such as iron powder.

In accordance with another embodiment of the invention, said photopolymeric material comprises from about 0.1 to about 10% of a conductive additive, such as salt.

The substrates on which the image is formed according to the present invention may be made of steel, polyester, or any other rigid material, coated or uncoated.

The printing plates obtained by the method of the present invention may be adapted to different types of printing such as letter-press, dry-offset, gravure, flexographic printing techniques or any other printing technique such as silk-screen printing.

The method of the present invention has the following, major advantages over the conventional methods:

i) it does not involve environmental pollution of any kind, since no solvent wash is required;

ii) it eliminates waste of photopolymeric material which does not participate in the formation of the image and must be washed away;

iii) it enables the production of printing, plates of any desired hardness and thickness which are suitable for various printing processes.

Said method is faster than any other conventional methods, 4 to 5 plates per hour against a maximum of one plate per hour with previous known photo-mechanical and engraving methods.

It should be emphasized that the image obtained by the method of the present invention is "grown" or "built up" from the substrate, as contrasted with any other conventional method for producing photopolymeric images or plates for she printing industry.

In accordance with an alternative embodiment of the invention, instead of the drum the apparatus may comprise a flat-bed table 11 as shown in FIG. 2. In this embodiment, the carriage and/or the flat-bed table are displaceable in mutually orthogonal directions.

The rotatable drum may also be replaced by cylinders having different diameters for producing plates or engraving blocks or sleeves without a seam.

Instead of one ink container, there may be present two containers, one for holding the ink composition and the other for holding the ferromagnetic powder, or any other additives needed for the ink-jet process.

BRIEF DESCRIPTION OF THE DRAWINGS

The present invention will further be described in detail with reference to the accompanying non-limiting drawings, in which:

FIG. 2 is a partial schematic view (in perspective) of an alternative embodiment of the apparatus according to the invention, including a flat-bed table 11 instead of the drum in FIG. 1.

As seen in FIG. 1, the photopolymeric printing apparatus, generally referenced as 1, comprises:

Figure 1:
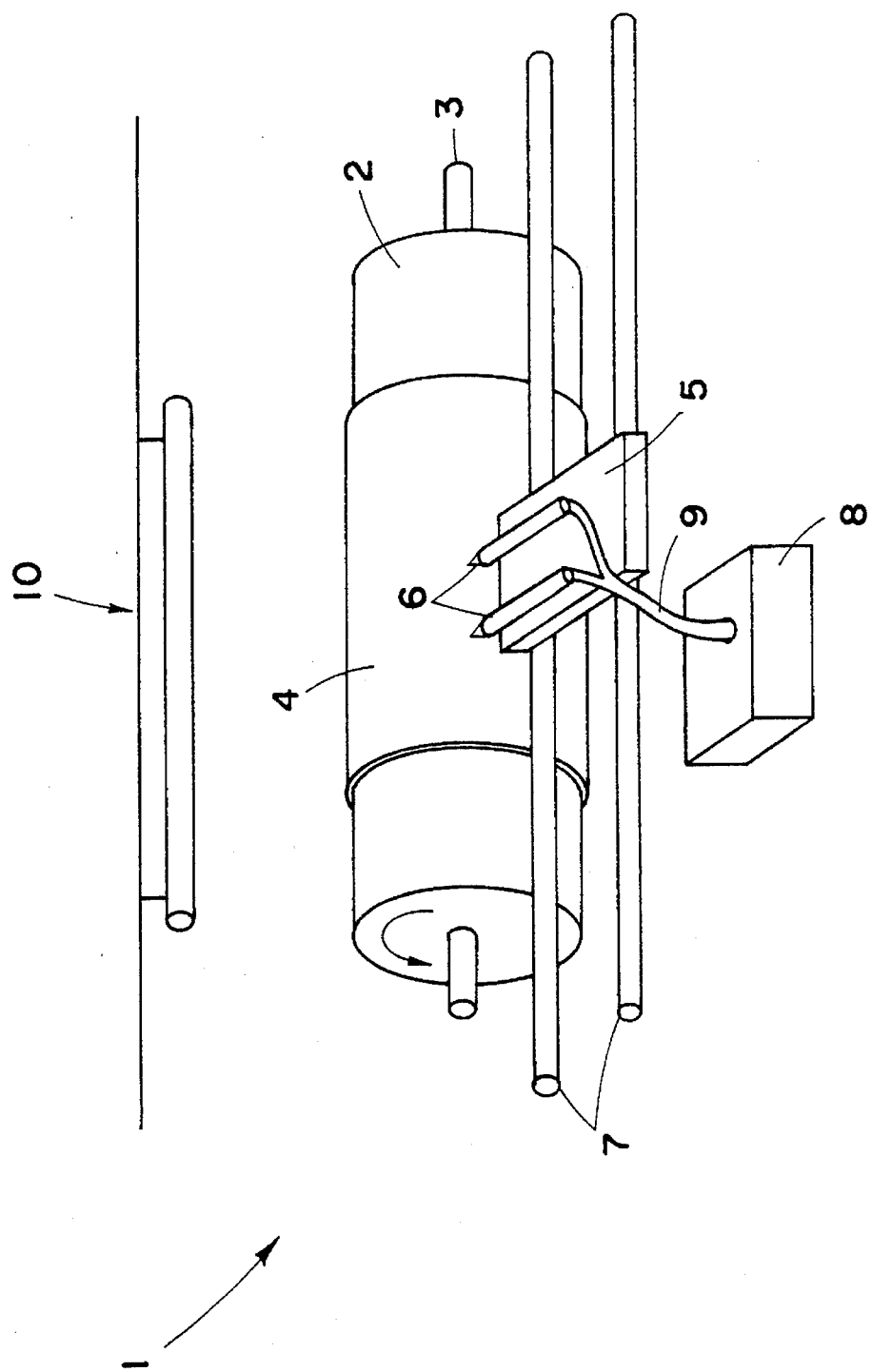
FIG. 1 is a partial schematic view (in perspective) of one embodiment of the apparatus according to the invention.

a drum 2 rotatable around a horizontal axis 3 supporting the printing substrate 4; a carriage 5 carrying a pair of nozzles 6 and horizontally displaceable on a pair of tracks 7, its motion being governed by a computer (not shown).

A photopolymeric ink composition is fed to the nozzles 6 from an ink container 8 via flexible tubes 9 having sufficient slack to allow free movement of the carriage 5. If necessary, the photopolymeric ink is preheated before it reaches the nozzles 6 by any suitable heating means (not shown).

The photopolymeric ink may be fed under pressure to the nozzles 6 from the ink container 8 by a pump (not shown).

The ink is intermittently ejected from the nozzles 6, also by command of the computer in a conventional manner, so as to form the desired image on the substrate 4.

The photopolymeric ink droplets ejected from the nozzles 6 are computer-controlled in any known manner to form the latent image on the substrate. For example, the ink droplet can be deflected by electrostatic field or, when the photopolymeric material comprises a ferromagnetic powder, by a magnetic field.

The image thus produced is cured by ultraviolet radiation provided by a UV source 10.

The invention is further illustrated by the following non-limiting examples.

EXAMPLE 1

A photopolymeric ink composition (XV5049, Ciba-Geigy) was warmed to 40° C. and 3% by weight of a very fine iron powder were added. The mixture thus obtained was inserted into a container of an ink-jet carriage. A steel sheet 0.25 mm thick was used as a substrate for the image produced by said ink composition droplets ejected from the nozzles placed on the carriage.

The image was cured by ultraviolet radiation and a plate carrying the projected image having a hardness of 80° A (Shore) was obtained in a ready to print form. This plate can be used for letterpress or dry-offset printing.

EXAMPLE 2

The procedure and materials were the same as in Example 1, except that a negative image was obtained. The plate was smoothed and coated by a thin layer of nickel. This plate can be used in Gravure printing.

EXAMPLE 3

The procedure was the same as in Example 1, except that the photopolymeric ink used was "Polymer Resin Hercules 500 SK" (Hercules, USA) which was pre-heated to 70° C. The substrate was a 0.25 mm thick polyester plate, having one rough face for carrying the image. After curing, the plate had a hardness of 25° A (Shore) and can be used for flexographic printing.

We claim:

1. A method for the production of photopolymeric relief-type printing plates comprising:

forming a positive or a negative image on a substrate by ink-jet printing with a photopolymeric ink composition, optionally preheated to a temperature of about 30°–260° C.; and subjecting the resulting printed substrate to UV radiation, thereby curing said ink composition forming said image.

2. A method according to claim 1, wherein the photopolymeric ink composition comprises from about 0.5 to about 20% of a ferromagnetic powder.

3. A method according to claim 1, wherein the photopolymeric ink composition comprises from about 0.1 to about 10% of a conductive additive.

* * * * *